United States Patent
Takizawa et al.

(10) Patent No.: US 7,340,320 B2
(45) Date of Patent: Mar. 4, 2008

(54) METHOD OF RECIPE CONTROL OPERATION

(75) Inventors: Masahiro Takizawa, Tama (JP); Takashi Wada, Tama (JP); Satoru Noguchi, Tama (JP)

(73) Assignee: ASM Japan K.K., Tokyo (JP)

( * ) Notice: Subject to any disclaimer, the term of this patent is extended or adjusted under 35 U.S.C. 154(b) by 358 days.

(21) Appl. No.: 11/105,052

(22) Filed: Apr. 13, 2005

(65) Prior Publication Data
US 2006/0234402 A1 Oct. 19, 2006

(51) Int. Cl.
*G06F 19/00* (2006.01)

(52) U.S. Cl. .................. 700/121; 324/230; 438/14; 702/170

(58) Field of Classification Search ............. 700/121, 700/21; 702/64, 170; 438/14; 324/230
See application file for complete search history.

(56) References Cited

U.S. PATENT DOCUMENTS

| | | | | |
|---|---|---|---|---|
| 6,465,263 B1 * | 10/2002 | Coss et al. | ..................... | 438/14 |
| 6,828,165 B2 * | 12/2004 | Tanaka et al. | ................. | 438/14 |
| 7,058,470 B2 * | 6/2006 | Tanaka et al. | .............. | 700/121 |
| 7,102,763 B2 * | 9/2006 | Ritzdorf et al. | ............. | 356/630 |
| 2006/0212156 A1 * | 9/2006 | Tanaka et al. | .............. | 700/121 |

FOREIGN PATENT DOCUMENTS

| | | |
|---|---|---|
| JP | 2002-343726 | 11/2002 |
| JP | 2003-077782 | 3/2003 |

\* cited by examiner

*Primary Examiner*—Leo Picard
*Assistant Examiner*—Douglas S Lee
(74) *Attorney, Agent, or Firm*—Knobbe, Martens, Olson & Bear LLP

(57) ABSTRACT

An operation method of a recipe control process in which multiple processing targets are processed continuously in a processing apparatus using recipes that specify a set of control parameters specifying the processing conditions of processing targets. The method comprises the steps of: (I) specifying correction coefficients to correct at least one of the parameters' values for each processing target, separately from the recipes, and (II) performing the recipe control process for multiple processing targets and applying the correction coefficients to each processing target to adjust the parameters' values.

20 Claims, 13 Drawing Sheets

FIG. 5

| SI | Ex | Process Name | Pre | PROCESS | Time 1 [sec] | POST | Time 1 [sec] |
|----|----|--------------|-----|---------|--------------|------|--------------|
| 01 | 05 | 8651-TEST1 | --- | 01:D-START | 10.0 | 02:E-START | 10.0 |
| 02 | 03 | 8561aaa | --- | 01:D-START | 10.0 | 02:E-START | 10.0 |
| 03 | 02 | 8651-TEST1 | --- | 01:D-START | 10.0 | 02:E-START | 10.0 |
| 04 | 04 | 8561 | --- | 01:D-START | 10.0 | 02:E-START | 10.0 |
| 05 | 09 | 8651-TEST1 | --- | 01:D-START | 10.0 | 02:E-START | 10.0 |
| 06 | 07 | 8651-TEST1 | --- | 01:D-START | 10.0 | 02:E-START | 10.0 |
| 07 | 06 | 8561-alarm | --- | 01:D-START | 10.0 | 02:E-START | 10.0 |
| 08 | 08 | 8651-TEST1 | --- | 01:D-START | 10.0 | 02:E-START | 10.0 |
| 09 | 01 | 8651-TEST1 | --- | 01:D-START | 10.0 | 02:E-START | 10.0 |
| 10 | 10 | 8651-TEST1 | --- | 01:D-START | 10.0 | 02:E-START | 10.0 |
| 11 | 11 | 8651-TEST1 | --- | 01:D-START | 10.0 | 02:E-START | 10.0 |

FIG. 10

| Step No. | 000 | 001 | 002 | 003 |
|---|---|---|---|---|
| Step Name | READY | D-START | DEPO | D-END |
| Step Time | 00:00:00.0 | 00:00:05.0 | 00:00:10.0 | 00:00:05.0 |
| (sccm) | 0 (close) | 0 (close) | 167 (close) | 0 (close) |
| (slpm) | 0.00 (close) | 0.00 (close) | 0.00 (close) | 0.00 (close) |
| (slpm) | 0.00 (close) | 0.00 (close) | 0.00 (close) | 0.00 (close) |
| (sccm) | 0 (close) | 0 (close) | 0 (close) | 0 (close) |
| (slpm) | 0.00 (close) | 0.00 (close) | 0.00 (close) | 0.00 (close) |
| (slpm) | 0.00 (close) | 0.00 (close) | 0.00 (close) | 0.00 (close) |
| (slpm) | 0.00 (close) | 0.00 (close) | 0.00 (close) | 0.00 (close) |
| (sccm) | 0 (close) | 0 (close) | 0 (close) | 0 (close) |
| RC Press (Pa) | 0.0 (pmpoff) | 0.0 (pmpoff) | 400.1 (pmpoff) | 0.0 (pmpoff) |
| RF-Fwd (W) | 0 (off) | 0 (preset) | 0 (off) | 0 (off) |
| RF-TUNE (%) | RF-OFF | 0 | RF-OFF | RF-OFF |

FIG. 11

METHOD OF RECIPE CONTROL OPERATION

BACKGROUND OF THE INVENTION

1. Field of the Invention

This invention relates to an operation method of a recipe control process designed to control film deposition on semiconductor wafers, among others, and also to a method to correct the recipe for each processing target such as wafer.

2. Description of the Related Art

Embodiment of continuous film deposition on the wafers to be produced on a sheet-feed type semiconductor manufacturing system requires that film be deposited on a specified number of wafers in a reactor chamber through a control like the one shown in FIGS. 8 and 9, after which a cleaning process be performed in which specific gas is introduced to clean the reactor chamber. First, a system recipe is started (S1). Then, the system is initialized and initial values are set (S2). Initial values include cleaning counter and lot counter settings, the number of wafers to be processed before a cleaning process is performed, and the number of wafers to be processed per lot (total number of wafers to be set). Next, a wafer film deposition subroutine is called and film deposition is started (S3). This wafer film deposition subroutine is controlled by a process recipe. As shown in FIG. 9, once the wafer film deposition process is started (S110) the recipe settings that have been input in advance are loaded (S120). Recipe control is performed in accordance with these settings (S140) until film deposition on the wafer is completed (S150).

After completion of film deposition on one wafer, the cleaning counter is incremented by one, along with the lot counter that is also incremented by one (S4). Next, the lot counter is checked to determine whether or not the number of wafers to be processed per lot, as set in step S2, has been reached. If the specified number is not yet reached, then the cleaning counter is checked to determine whether or not the number of wafers to be processed before cleaning, as set in step S2, has been reached (S6). If the specified number is not yet reached, the processing flow returns to the wafer film deposition process (S3). If the specified number has already been reached, the cleaning process is started, after which the cleaning counter is reset to zero (S7) and the processing flow returns to the wafer film deposition process (S3). If the specified number of wafers to be processed per lot has already been reached in step S5, whether or not the cleaning counter is zero is then determined (S8). If the cleaning counter is not zero, the cleaning process is performed, after which the cleaning counter is reset to zero (S9) and the system operation ends (S10). If the cleaning counter is zero in step S8, the system operation ends immediately (S10).

FIG. 10 is an example of the system recipe operation screen. In this example, RC1 (reactor chamber 1) is selected among the tabs (100), in order to process in this reactor chamber the wafers stored under respective slot numbers (S1) (102) corresponding to the slots in the cassette. The execution sequence is specified as shown in the wafer execution sequence (Ex) field (101). In this example, the wafer in slot 9 is executed first, followed by those in slot 3, slot 2, and so on. Various patterns can be specified for executing the stored wafers, in addition to the ascending order or descending order of slot numbers. In the Process Name field (103), a desired process recipe to be executed in the reactor chamber is specified for each wafer. It is also possible to specify a wafer transfer pattern in each process recipe.

FIG. 11 is an example of the operation screen for a process recipe specified in the Process Name field (103) in FIG. 10 (the gas type field is intentionally left blank). In a process recipe, various control elements that define wafer processing, such as pressure, temperature and gas flow rate, can be set. The time of each step can also be set in the Step Time field (110). For example, the film deposition (DEPO) step is set to 10 seconds.

As explained above, the purpose of the recipe control operation is to package all relevant conditions and specify applicable conditions for each slot in advance. As shown in FIG. 9, once the film deposition process is started for the wafers in the specified slots, the recipe settings that have been input in advance are loaded and recipe control is performed in accordance with these settings. Since a process recipe is already specified for each of the predefined slots, however, changes occurring in the condition inside the reactor chamber cannot be reflected to change the processing accordingly.

SUMMARY OF THE INVENTION

For example, if the reactor chamber is to be cleaned after each film deposition run (called "single-deposition, single-etching"), the film deposition conditions need not be changed every time. However, if cleaning is to be performed after film has been deposited on multiple wafers (called "multiple-deposition, single-etching"), the condition inside the reactor chamber will change as the number of wafers on which film is deposited increases. If the same conditions are used continuously to implement film deposition in the latter case, the results of film deposition on individual wafers will become inconsistent. To eliminate such inconsistency that occurs as the number of processed wafers changes, the period during which film deposition gas is introduced can be adjusted in accordance with the number of wafers on which film has been deposited after each cleaning process.

With respect to this adjustment of film-deposition-gas introduction period, the 10-second setting in the Step Time field (110) for DEPO on the process recipe screen shown in FIG. 11 can be changed for each slot, for example. In other words, the film deposition step time can be changed for each slot in accordance with the number of processed wafers, within the file that defines in a special format the processing method for wafer film deposition such as steps, step times and control methods. This can be achieved, for example, by specifying in advance the film deposition step time for each wafer to be processed based on the film thickness data obtained from testing. Since a cleaning process is performed after film has been deposited on a specified number of wafers, the film deposition step time can be specified as a period from immediately after a cleaning process is performed until immediately before the next cleaning process is performed, and this period can be repeated after each cleaning process. FIG. 12 shows an example of how film deposition step times can be specified in a recipe where a cleaning process is performed after deposition of film on five wafers. In actuality, this operation is performed on a screen like the one shown in FIG. 11. FIG. 12 is a simplified illustration where only the film deposition times are extracted. As shown in FIG. 10, the sequence of wafer processing (1) is specified using slots. In FIG. 12, the wafer processing sequence corresponds to the ascending order of slot numbers. An applicable film deposition time is specified in seconds (3) for each wafer to be processed, with the film deposition time changed depending on the number of wafers that have been processed after cleaning.

If the scheduled wafers are not set in the cassette stage (CS), or when the wafer mapping failed for some reason and the wafers could not be recognized correctly, cleaning processes cannot be performed according to the schedule; i.e., cleaning cannot be performed after deposition of film on the specified number of wafers. In this case, the film deposition step time for each wafer will differ from the intended time specified in the aforementioned recipe. As a result, the expected film deposition result can no longer be achieved. FIG. 13 gives an example of offset film deposition step times because the third wafer in the processing schedule is missing. FIG. 13 assumes that, among the 25 wafers to be processed, the wafer in slot 3 as specified in the slot field (1) is not available for some reason. In this case, cleaning is still performed after processing of five wafers according to the control program in FIG. 8. Since there is no wafer in slot 3, however, a cleaning process is performed after deposition of film on the wafers in slots 4, 5 and 6. Therefore, while the film deposition step time originally specified for the wafer in slot 6 is 59.4 seconds, this represents the time of the wafer film deposition step immediately after a cleaning process and implementing film deposition based on this step time before a cleaning process is performed will not achieve the intended film deposition result. In FIG. 13, all wafer film deposition step times are offset after slot 3.

These offsets occur because when a cleaning process is to be started is specified in accordance with the number of processed wafers, regardless of the slot numbers. These offsets will, in the above case, change the film deposition time immediately before a cleaning process from the original setting of 61.8 seconds to 59.4 seconds, thus generating an offset of more than 2 seconds. This problem is not limited to cleaning processes. Offsets always occur when the processing conditions are changed based on the number of processed wafers.

Consequently, in an embodiment, an object of the present invention is to solve the aforementioned problems by providing a method to control the film deposition time for each wafer to be processed using a coefficient of film deposition step time that takes into consideration the number of wafers processed after cleaning, instead of specifying fixed times under each recipe. The present invention is not limited to semiconductor manufacturing systems, cleaning processes, etc., but it instead can be applied widely to recipe control operations. In the present invention, time is not the only parameter that can be controlled, and the proposed method can also be applied to recipe controls with respect to temperature, flow rate, pressure, and so on. Furthermore, the present invention can be effectively applied to recipe controls where the condition in the reactor chamber changes.

In an embodiment, the present invention provides an operation method of a recipe control process in which multiple processing targets are processed under conditions continuously in a processing apparatus using recipes that specify a set of control parameters specifying the processing conditions of processing targets; wherein the aforementioned method comprises the steps of: (I) specifying correction coefficients which correct at least one of the parameters' values for each processing target, separately from the recipes, and (II) performing the recipe control process for multiple processing targets, and applying the correction coefficients to each processing target to adjust the at least one of the parameters' values.

The aforementioned embodiment can include at least embodiments specified below.

The aforementioned correction coefficients are functions of count of processed targets. By setting correction coefficients by which setting values in the recipes can be multiplied (such as those given as ratios or percentages), they can be easily applied to other recipe controls. Correction coefficients themselves may be increased or decreased according to the count of processed targets, such as 1.1, 1.2 and 1.3, or in the reverse order, but they can also be expressed by a formula where the count of processed targets is given by N, as in $(1+0.1 \times N)$. Typically, correction coefficients are predefined through experiments, etc., and inputted to the system in advance. Once inputted, these correction coefficients can be stored in a memory device such as a CPU so that appropriate correction coefficients can be loaded as necessary. Also, correction coefficients basically change according to the count of processed targets. Typically, correction coefficients change continuously until the processing environment undergoes a discontinuous change. Once the processing environment undergoes a discontinuous change (such as when the environment changes after a cleaning process), the applicable correction coefficients also change discontinuously.

Furthermore, the above method can include a step of resetting the count every time a state inside the processing apparatus changes. If a cleaning process is performed, for example, a cleaning counter can be used as a correction coefficient counter.

In another embodiment, the aforementioned processing target is a semiconductor substrate. In yet another embodiment, the aforementioned processing is a film deposition process on semiconductor substrates. In still another embodiment, the aforementioned at least one parameter is film deposition time. As an example, a case can be considered in which the aforementioned processing target is a semiconductor substrate, the aforementioned process is a film deposition process on the aforementioned semiconductor substrates, and the state change inside the processing apparatus is caused by a cleaning process in the processing apparatus.

In another embodiment, the present invention provides an operation method of a processing system in which one processing that includes multiple processing operations is repeated multiple times and in which the conditions of each processing operation are controlled by parameters; wherein the aforementioned method comprises the steps of: (I) specifying a recipe that assigns values of the aforementioned parameters to each processing operation in each processing run, (II) specifying correction coefficients separately from the aforementioned recipe, to correct for each processing run at least one of the parameters' values in at least one of the aforementioned multiple processing operations to be repeated multiple times, and (III) starting processing according to the aforementioned recipe and applying the aforementioned correction coefficients only in the processing runs where the aforementioned recipe is performed.

The aforementioned embodiment can include at least the embodiments specified below.

The aforementioned processing is a processing of semiconductor substrates, and the number of runs of the aforementioned processing corresponds to the number of semiconductor substrates. Furthermore, the aforementioned at least one process is a film deposition process on semiconductor substrates. The aforementioned at least one parameter is film deposition time.

Also in a given embodiment, the aforementioned correction coefficients return to their initial values every time the state inside the reactor chamber changes. The aforementioned state change inside the reactor chamber is caused by a cleaning process in the aforementioned reactor chamber, for example.

In addition, in yet another embodiment, the present invention provides an operation method of a processing that comprises the steps of: (I) specifying correction coefficients in advance, to correct for each processing run at least one of the parameters' values specifying the processing conditions in the processing to be repeated multiple times, and (II) starting the aforementioned processing and applying the aforementioned correction coefficients only in the processing runs where the aforementioned processing is performed.

The aforementioned embodiment can include at least the embodiments specified below.

A step in which film deposition is performed by using correction coefficients to correct, for each semiconductor substrate, a recipe that specifies the film deposition conditions is included. In one embodiment, the aforementioned correction coefficients are a set of coefficients applied when the state inside the reactor chamber changes and these coefficients return to their initial values every time the aforementioned state changes. In another embodiment, the aforementioned state change inside the reactor chamber is caused by a cleaning process in the reactor chamber. The aforementioned cleaning process is performed, for example, after deposition of film on multiple semiconductor substrates. In yet another embodiment, the aforementioned correction coefficients apply to the time of film deposition on semiconductor substrate.

In still another embodiment, the present invention provides a processing system in which one processing that includes multiple processes is repeated multiple times and in which the conditions of each process are controlled by parameters; wherein the aforementioned processing system comprises: (A) a unit that specifies a recipe for assigning the aforementioned parameters' values to each process in each processing run, (B) a unit that specifies, separately from the aforementioned recipe, correction coefficients to correct, for each processing run, at least one of the parameter values in at least one of the processes among the aforementioned multiple processes to be repeated multiple times, and (C) a unit that starts the processing according to the aforementioned recipe and applies the aforementioned correction coefficients only in the processing runs in which the aforementioned recipe is performed.

With respect to the above description, the requirements in a given embodiment are interchangeable with or additional to the requirements in a different embodiment, and the requirements in different embodiments can be combined. It should be noted that the present invention is not limited to the aforementioned embodiments, but it instead includes other embodiments that can achieve one or more of the objects described above or any other object.

BRIEF DESCRIPTION OF THE DRAWINGS

The present invention is explained further using drawings. It should be noted that the present invention is not limited to these drawings. It should also be noted that the drawings are oversimplified for illustrative purposes.

FIG. 5 is a schematic drawing showing the input screen for cleaning recipes and correction coefficients pertaining to one embodiment of the present invention.

FIG. 10 is a schematic drawing showing the system recipe input screen of a conventional semiconductor manufacturing system.

FIG. 11 is a schematic drawing showing the process recipe input screen of a conventional semiconductor manufacturing system.

DETAILED DESCRIPTION OF THE PREFERRED EMBODIMENT

Figure 1:
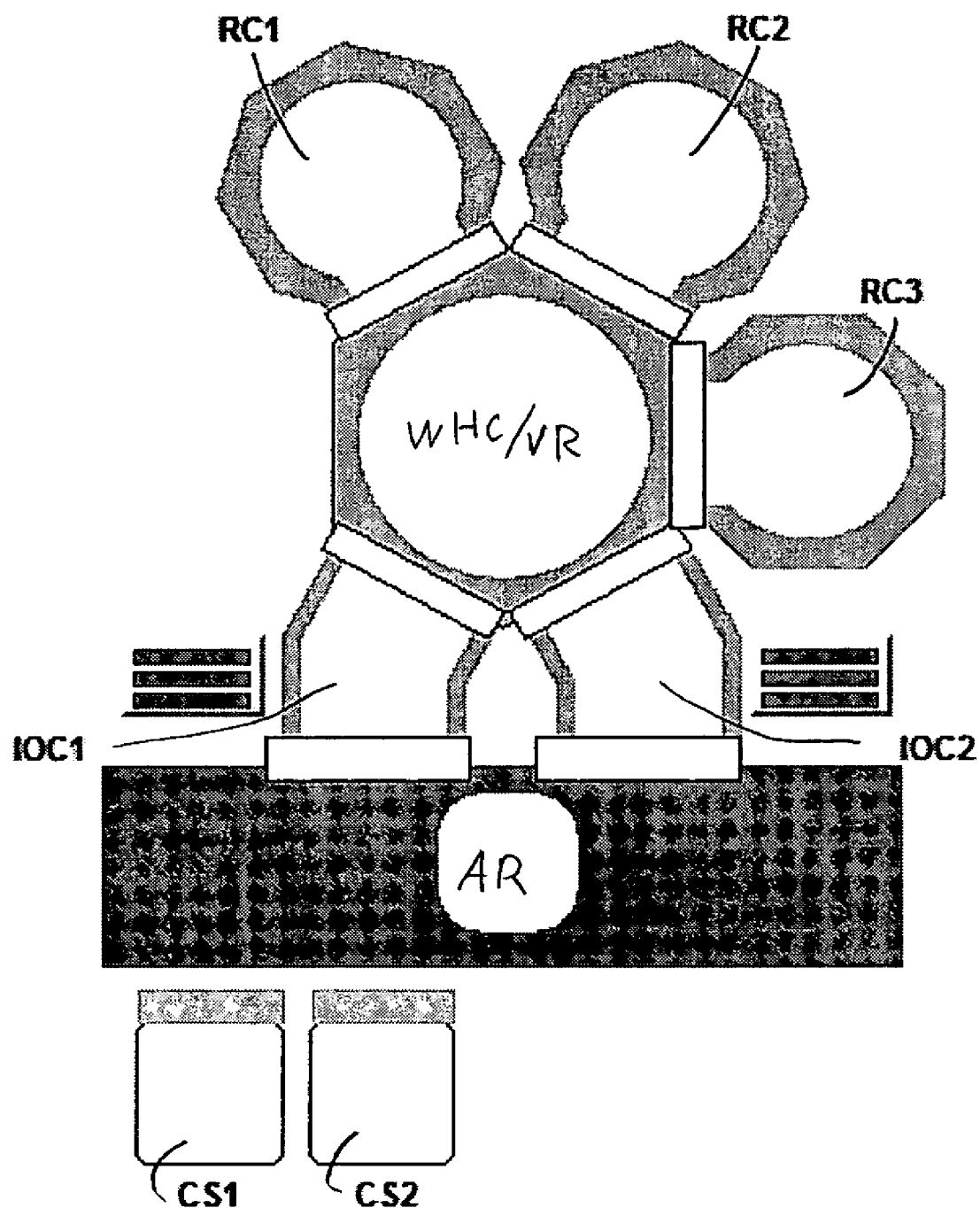
FIG. 1 is a schematic drawing showing one example of a semiconductor manufacturing system to which the present invention can be applied.

The present invention is not limited to applications involving a semiconductor manufacturing system or film deposition time after a cleaning process, but it instead can be applied widely to recipe control operations. As a matter of convenience, the present invention is explained below using film deposition time after a cleaning process as an example.

In this embodiment, the purpose of the present invention is to provide a system control software that allows for input and storage of correction coefficients of film deposition step time that take into consideration the number of wafers processed after a cleaning process, instead of specifying in a recipe a film deposition time for each wafer to be processed. A embodiment that achieves the aforementioned purpose is one in which a correction coefficient of film deposition step is registered in the system control software for each wafer to be processed after a cleaning process, where calculation of the applicable correction coefficient of film deposition time as part of recipe control ensures that the correct film deposition step time will be applied to each wafer even when the scheduled wafer is not present. Here, one embodiment is considered where the correction coefficients to be registered in the control software do not specify a film deposition step time itself. Instead, they specify a ratio of change (in percentage) relative to the base film deposition step time as defined in the applicable recipe and can therefore be used for other recipes using different film deposition times. The aforementioned method ensures that the correct film deposition step time will be applied to each wafer, even when the wafer scheduled for processing is not present, thereby suppressing inconsistency in film deposition result among individual wafers.

Wafers are placed in a cassette and set in a cassette stage at the beginning. Once wafers are set, presence or absence of these wafers can be detected using a laser sensor. The present invention is also effective in conditions in which some wafers are not present (these wafers are called "missing wafers"), or when they are not recognized correctly and thus falsely determined as absent when the corresponding wafers are actually present. If a given wafer is not detected, the film deposition process is not performed and the applicable slot is skipped.

It is extremely difficult, only by means of recipe control, to execute processing in a manner reflecting condition changes in the reactor chamber. In the case of missing wafers as well as when there are multiple reactor chambers or when a cluster-type system is used, it is impossible to predict in advance the film deposition order of a given wafer based on the slot processing sequence. In one embodiment of the present invention, film deposition time is changed dynamically to ensure that wafers will be always processed based on the correct film deposition times.

The following explains embodiments of the present invention using the drawings. It should be noted that the present invention is not limited to these drawings and embodiments.

FIG. 1 is a schematic drawing showing one example of a semiconductor manufacturing system to which the present invention can be applied. First, cassettes that can each store 25 wafers are set in cassette ports (cassette stages CS1, CS2) on this system. Next, slots in the cassettes in which a wafer is set are determined through wafer mapping. Thereafter, the wafers are transported to wafer input/output containers (in-out chambers IOC1, IOC2) by means of an atmospheric robot (AR) in accordance with the specification of the system recipe, after which they are transported to processing containers (reactor chambers RC1, RC2, RC3) by means of a vacuum robot (VR) equipped in a wafer transfer container (wafer handling chamber WHC) and then the process recipe is executed in the aforementioned reactor chambers. Once the process recipe ends, the wafers are returned to their original slot positions by following the above sequence in the reverse order.

Typically, recipes refer to computer programs, rules, specifications, operations and procedures performed each time to produce an object such as a wafer. However, they can also include all other recipes that can be understood by those skilled in the art. Also, recipes include setup and other recipes in addition to the system recipes and process recipes explained above. Application of recipe control is not limited to semiconductor manufacturing.

Figure 2:
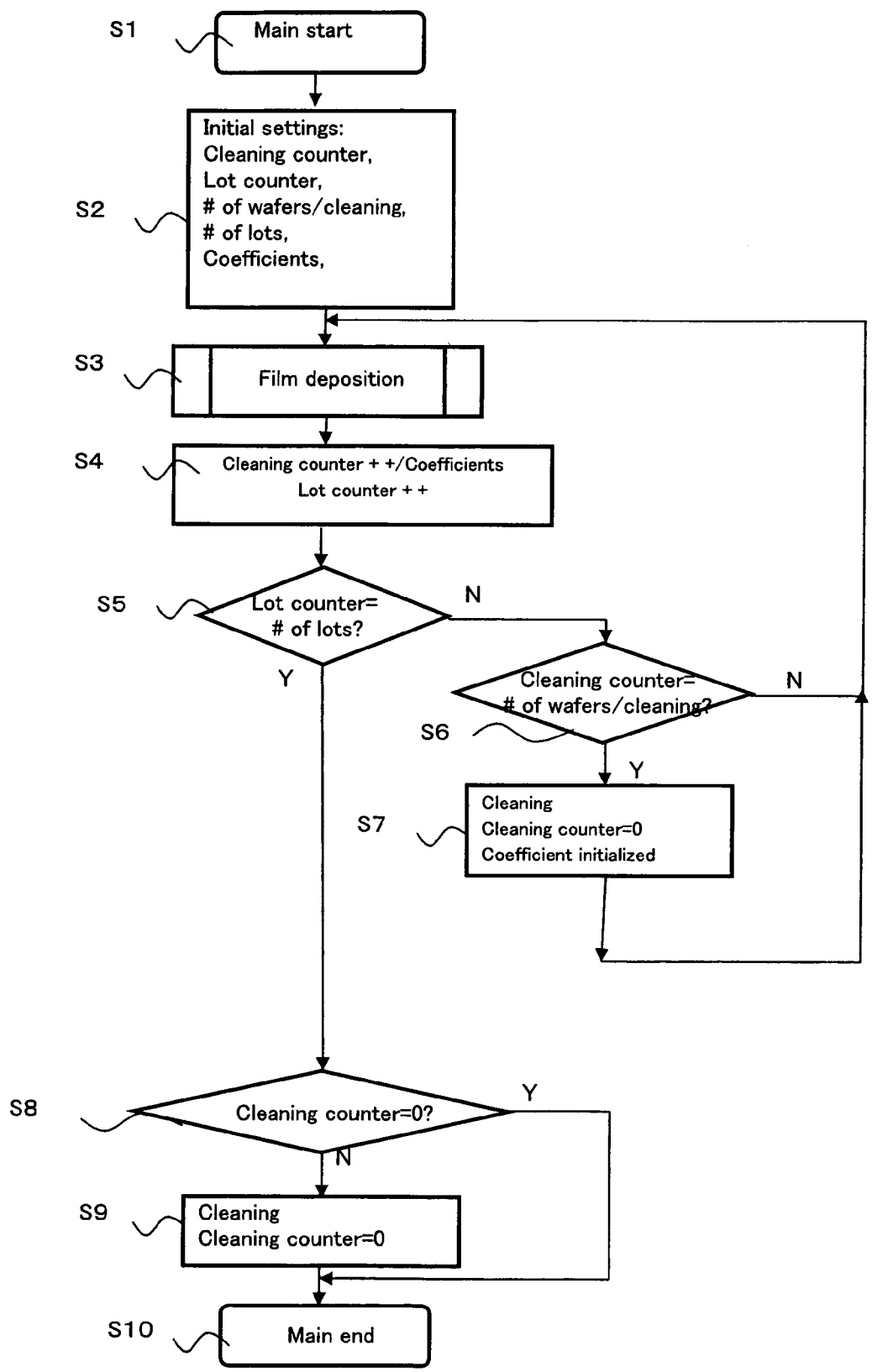
FIG. 2 is a flowchart showing the function of the main control routine of a semiconductor manufacturing system pertaining to one embodiment of the present invention.
Figure 3:
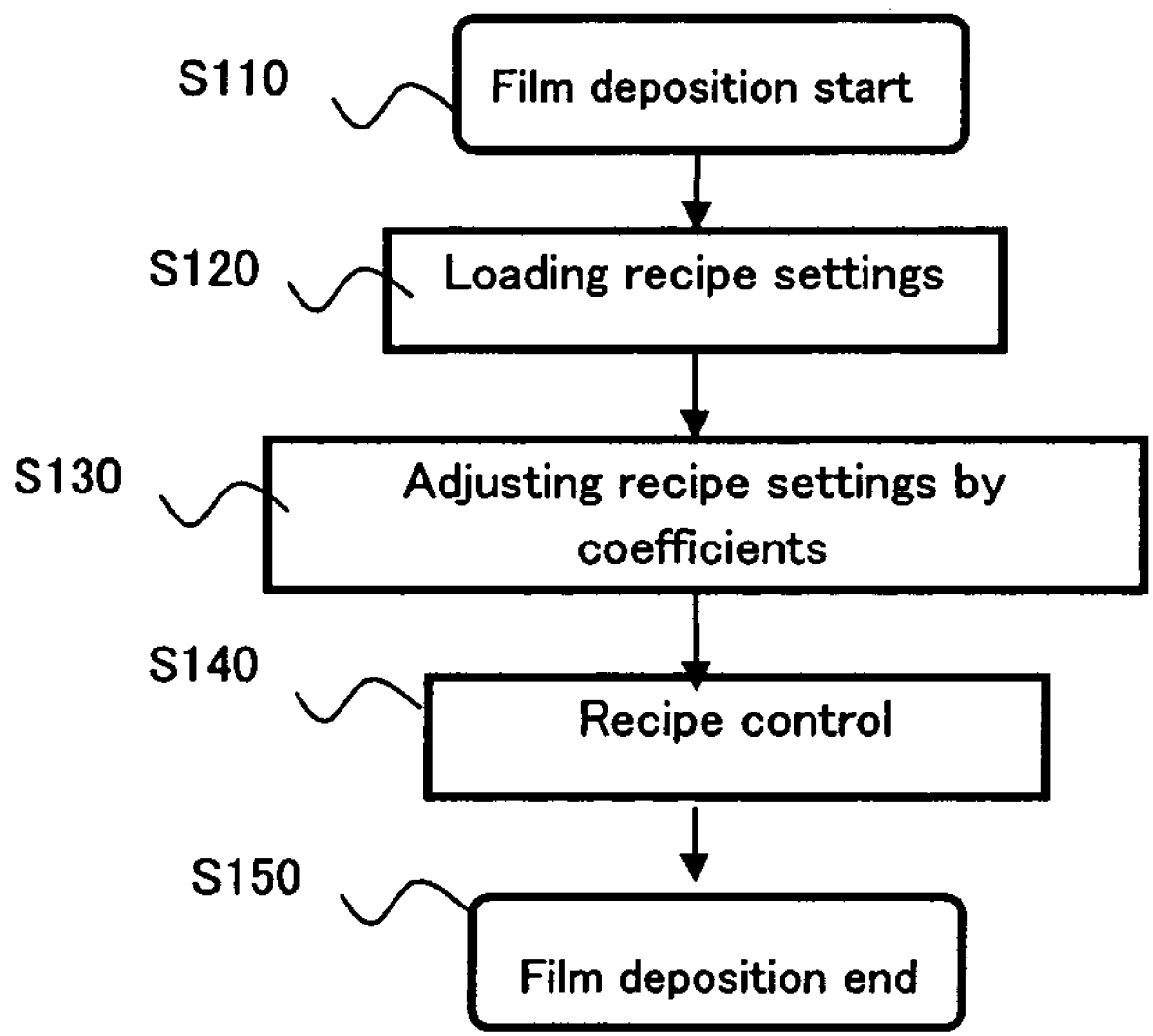
FIG. 3 is a flowchart showing the function of the wafer film deposition subroutine of a semiconductor manufacturing system pertaining to one embodiment of the present invention.
Figure 6:
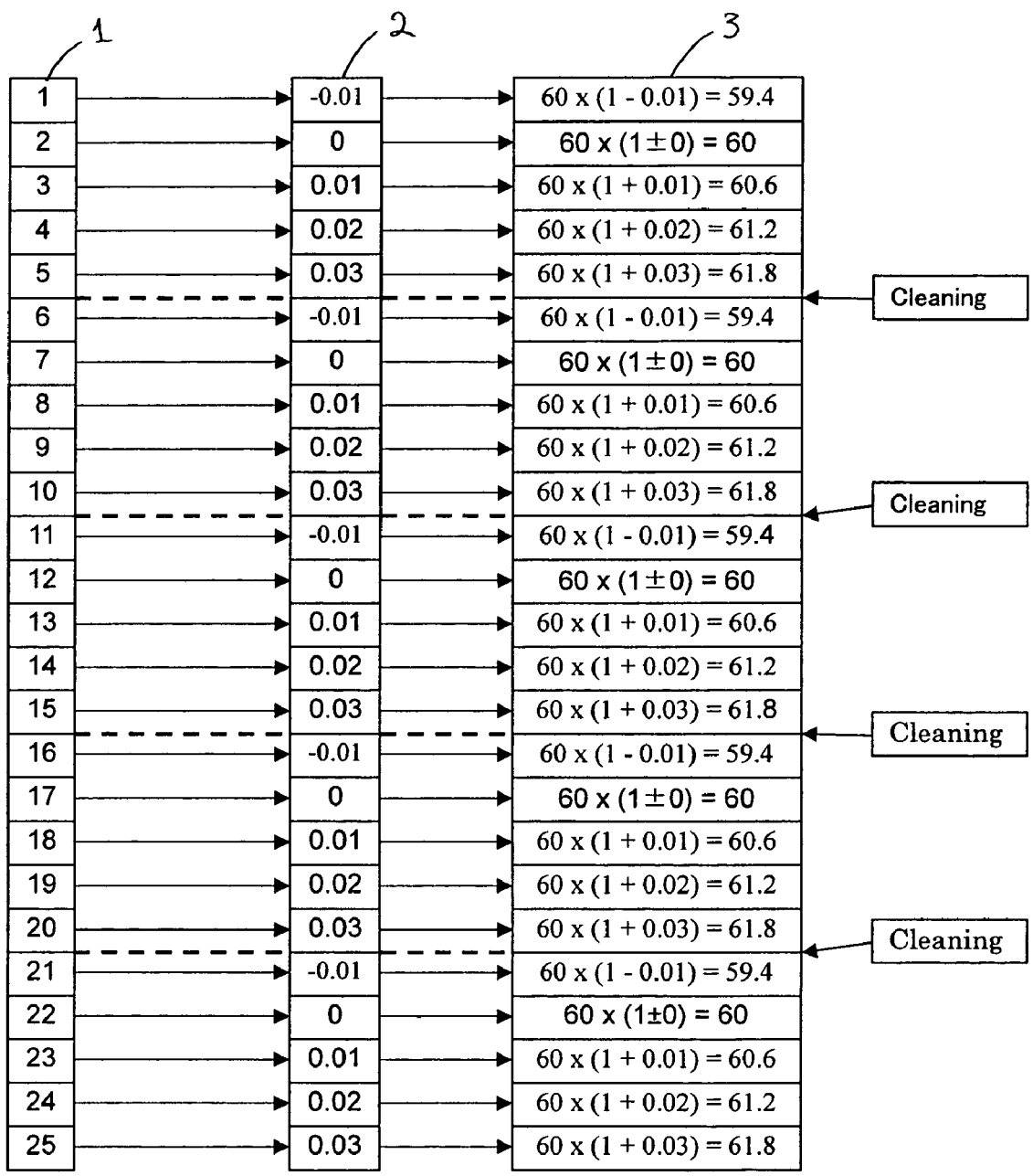
FIG. 6 is a drawing showing an example of controlling, by means of correction coefficients, the recipe-specific step time for each wafer to be processed on a semiconductor manufacturing system pertaining to one embodiment of the present invention.

FIGS. 2, 3 and 6 show examples of wafer film deposition process on a semiconductor manufacturing system pertaining to one embodiment of the present invention. In FIG. 2, the main control routine consists of the eight steps explained below. Specifically, processing is started in step S1, and initial values of counters and other local variables to be used in the wafer film deposition process are set in step S2. Correction coefficients are also set in this step. In step S3, the wafer film deposition subroutine is called to deposit film on a wafer. In step S4, each counter is incremented based on completion of film deposition. In step S5, judgment is made as to whether or not the lot counter has reached the specified number of wafers. If the specified number of wafers to be processed per lot is not yet reached, the processing flow proceeds to the next step, or S6. In step S6, judgment is made as to whether or not the cleaning counter has reached the specified number of wafers before cleaning. If this counter has already reached the specified number, the processing flow proceeds to the next step, or S7. If the specified number is not yet reached, the processing flow returns to the wafer film deposition subroutine in step 3. In step S7, the reactor chamber is cleaned and then the cleaning counter is reset to zero. At the same time, the correction coefficient is also reset (initialized) to the value corresponding to the condition immediately after cleaning. If the lot counter has already reached the specified number in step S5, the processing flow proceeds to step S8 where judgment is made as to whether or not the cleaning counter is zero. In a setting where a cleaning process is performed after five wafers have been processed, cleaning is not performed after the last three wafers if one processing lot consists of a total of 23 wafers. This step is provided to perform a cleaning process after film deposition is completed on these three wafers. If the counter is zero in step S8, the processing flow proceeds to step S10 and ends. If the counter is not zero, a cleaning process is performed in step S9 in accordance with the counter value, after which the processing flow proceeds to step 10 and ends.

Next, the sample film deposition subroutine shown in FIG. 3 is explained. This subroutine is called in step S3 of the main routine illustrated in FIG. 2. Processing is started in step S110, and the recipe settings are loaded in step S120. Specifically, the settings of the recipe as stored in the storage media in the system controller are retrieved into the processing program. Here, film deposition step time is examined as an example. In step S130, the loaded recipe settings are recalculated as necessary. In this example, the film deposition step times in the recipe are recalculated based on the correction coefficient for each wafer as registered in the control program and also based on the cleaning counter value in FIG. 2. In step S140, the settings calculated in step S130 are used to perform actual recipe control. Specifically, the pressure, temperature and gas flow rate in the reactor chamber are controlled as film is deposited on a wafer. The subroutine ends in the last step of S150.

Figure 4:
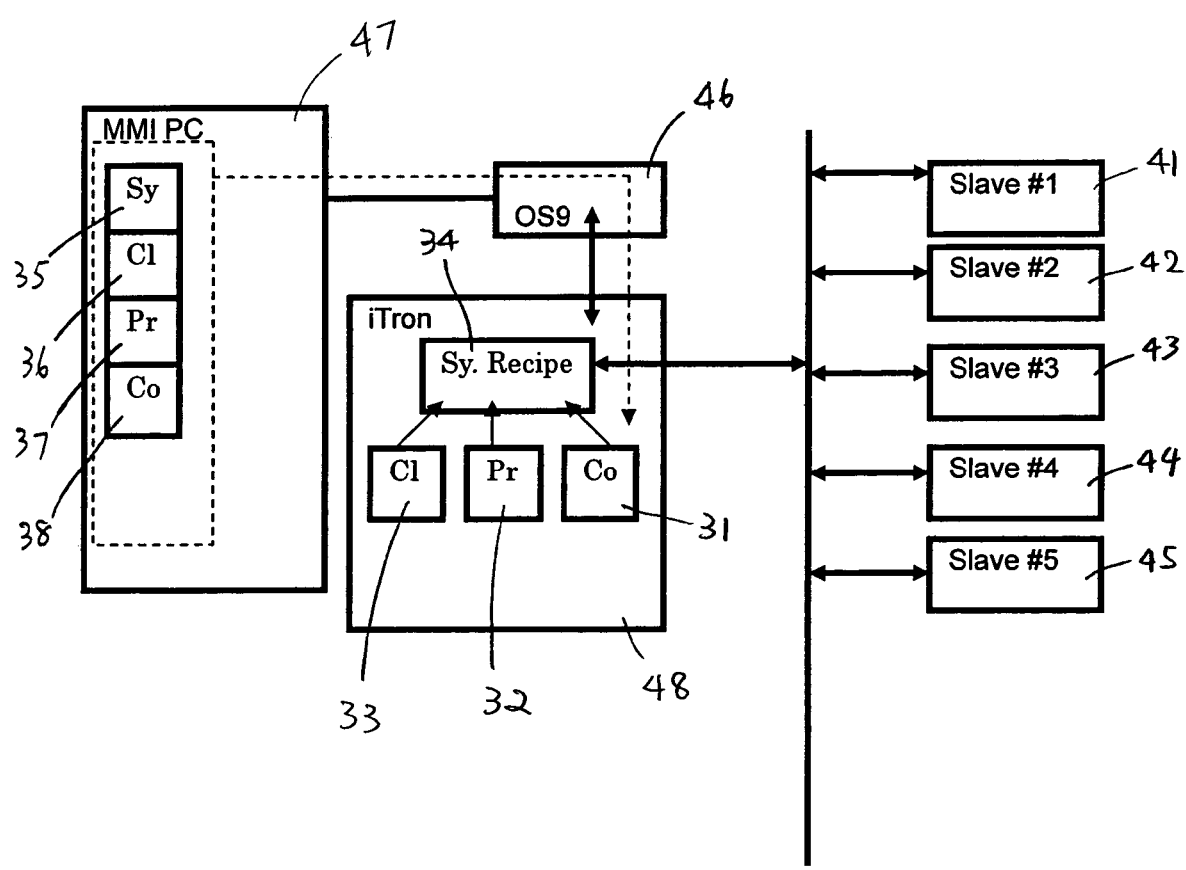
FIG. 4 is a schematic drawing showing the configuration of the control circuit of a semiconductor manufacturing system pertaining to one embodiment of the present invention.

FIG. 4 is a schematic drawing showing an example of the configuration of the control circuit of a semiconductor manufacturing system. Correction coefficients (Co) (38) are set in a MMI PC (Man Machine Interface PC, used for display) (47). In addition, system recipes (Sr) (35), cleaning recipes (Cr) (36) and process recipes (Pr) (37) are set via the MMI PC (47). The MMI PC (47) sends this information to a CPU board (used for communication with the MMI PC) (OS9) (46), and then input to the CPU board's main controller (iTron) (48). iTron (48) sets the input CI (33), Pr (32) and Co (31) as subroutines and instructs execution of a system recipe (34) to slave boards (41 to 45). When a process recipe execution instruction is issued, applicable correction coefficients of step time are specified to corresponding slave boards (41 to 43). Here, slave 1 (31) is reactor chamber 1 (RC1), slave 2 (42) is reactor chamber 2 (RC2), slave 3 (43) is reactor chamber 3 (RC3), slave 4 (44) is an atmospheric robot (AR), and slave 5 (45) is a wafer handling chamber/vacuum robot (WHC/VR).

As shown in FIG. 4, correction coefficients are not part of process recipes and therefore not assigned to slots. Instead, they are specified by the MMI PC (47) separately from process recipes. The system recipes (35) stored in the MMI PC (47) in FIG. 4 may be the same as those shown on the screen in FIG. 10, while the process recipes (36) may be the same as those shown on the screen in FIG. 11.

Figure 5:
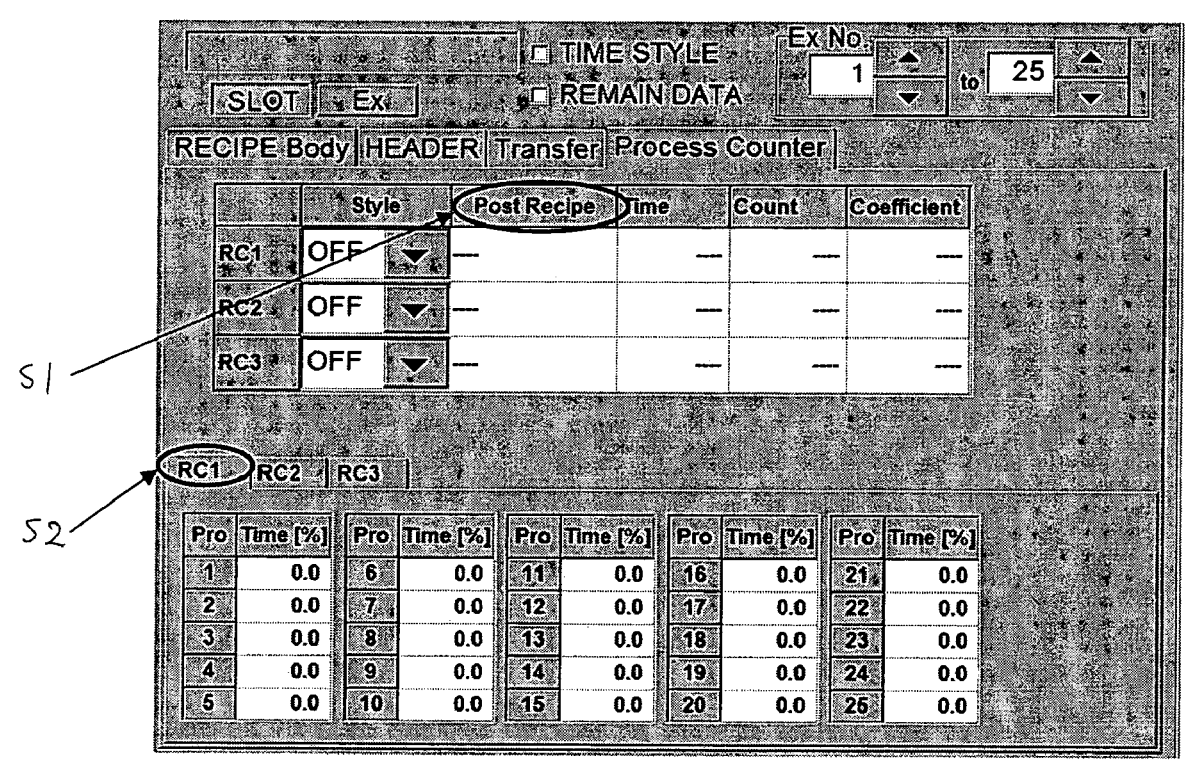

FIG. 5 is an example of the MMI PC screen used to specify the cleaning recipes (36) and correction coefficients (38) in FIG. 4. Clicking a blank field under Post Recipe (51) will show candidate process recipes, from which a desired recipe to be used for cleaning can be selected. Also, correction coefficients for up to 25 wafers can be specified for each reactor chamber (Pro1 to 25). In other words, multiple-deposition, single-etching can be executed where the number of depositions can be any value up to 25. Although the correction coefficients shown here are film deposition times (Time) indicated in %, they can be indicated by decimal numbers instead of percent values. It is possible to manually input correction coefficients first and then store the data in the MMI.

FIG. 6 explains how the recipe setting calculation in step S130 of FIG. 3 is performed in a given embodiment. In a recipe, multiple parameters (temperature, pressure, gas, etc.) are specified. If multiple reactor chambers are available, the wafer processing sequence can become complex. In FIG. 6, only film deposition times are shown in a simple manner for clarification. The column indicated by numeral 1 lists 25 wafers stored in the wafer container. One wafer is set in each slot. This semiconductor manufacturing system stores a correction coefficient of recipe-specific film deposition time (2) for each of these wafers. These correction coefficients are applied in accordance with the number of wafer film deposition runs performed after each cleaning process. If a maximum of 25 wafers are processed in one lot, 25 correction coefficients must be stored. As a matter of convenience, however, the example in this figure assumes that a cleaning process is performed after film has been deposited on five wafers and therefore only five correction coefficients are specified. In FIG. 6, the correction coefficients indicated by numeral 2 are −0.01, 0, 0.01, 0.02 and 0.03 in the order of application. These are assumed to be values obtained by a test in which a cleaning process was performed after deposition of film on every five wafers. The recipe-specific film deposition times indicated by numeral 3 assume that the base film deposition step time of the recipe as stored in the storage media in the system controller is 60 seconds. An appropriate recipe-specific film deposition step time can be obtained by applying the applicable correction efficient (2) to the base recipe-specific step time. In this example, the recipe-specific step times of 59.4, 60, 60.6, 61.2 and 61.8 seconds are used for each group of five wafers, as calculated by applying the respective correction coefficients to the base recipe-specific step time of 60 seconds.

Figure 12:
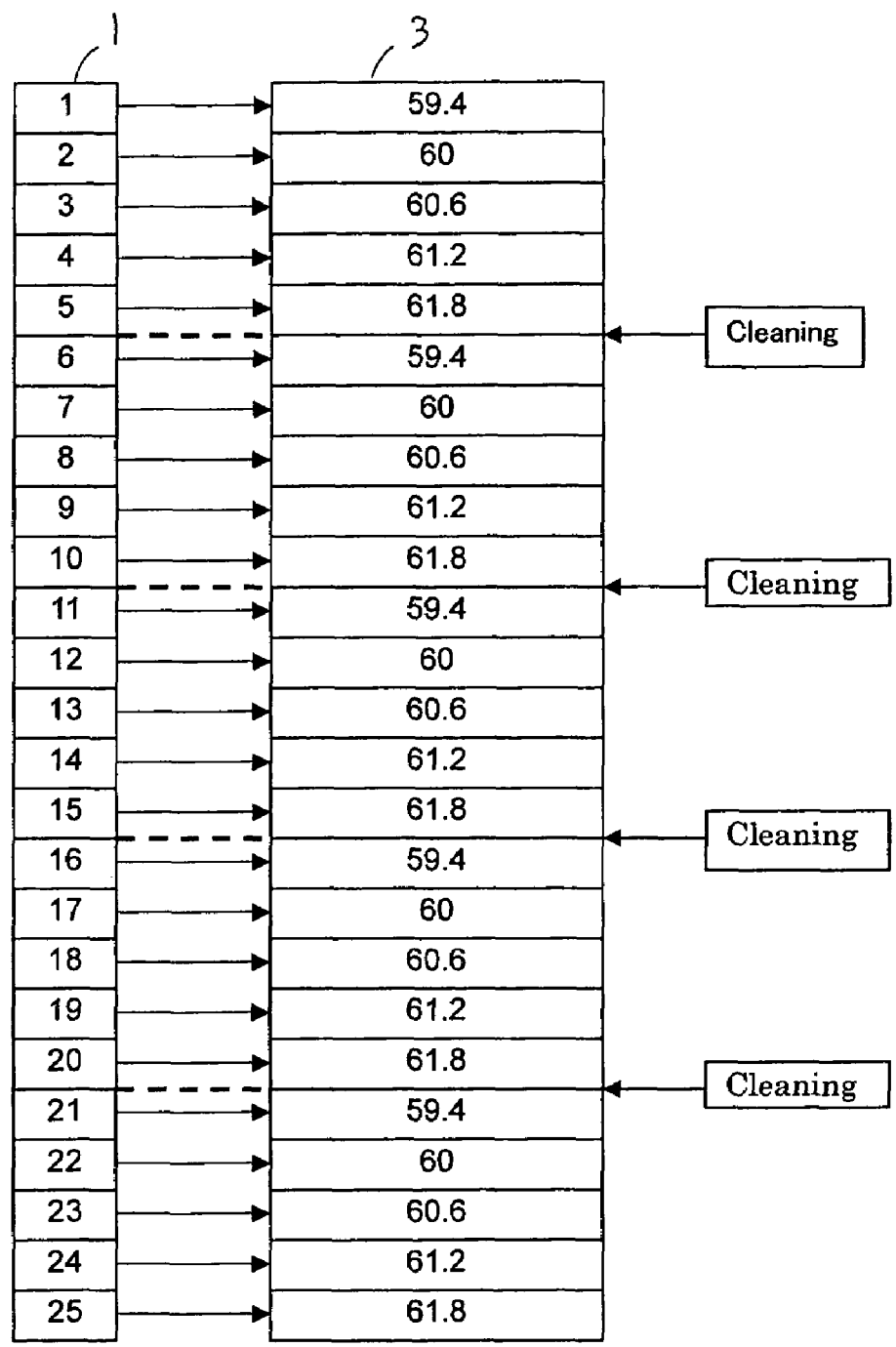
FIG. 12 is a drawing showing an example of control in which the recipe-specific step time for each wafer to be processed is specified directly in a recipe on a conventional semiconductor manufacturing system.

In FIG. 12, the recipe-specific film deposition step times (3) are specified directly, because no correction coefficients are available unlike in FIG. 6 where the coefficients (2) are specified as explained. Here, the step times of 59.4, 60, 60.6, 61.2 and 61.8 seconds are specified for each group of five wafers on the assumption that a cleaning process is performed after deposition of film on every five wafers.

Figure 7:
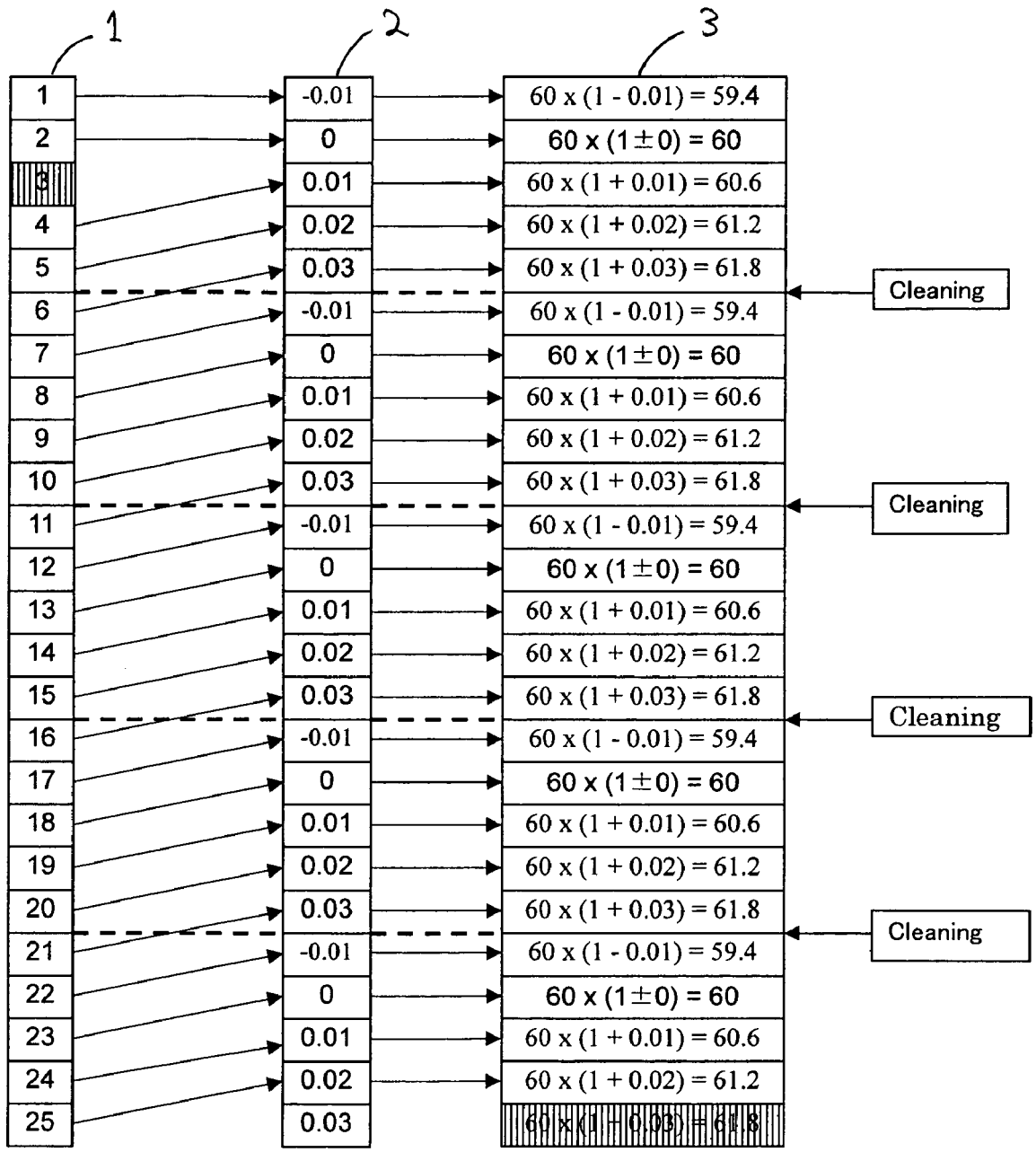
FIG. 7 is an example showing another example of controlling, by means of correction coefficients, the recipe-specific step time for each wafer to be processed on a semiconductor manufacturing system pertaining to one embodiment of the present invention.
Figure 13:
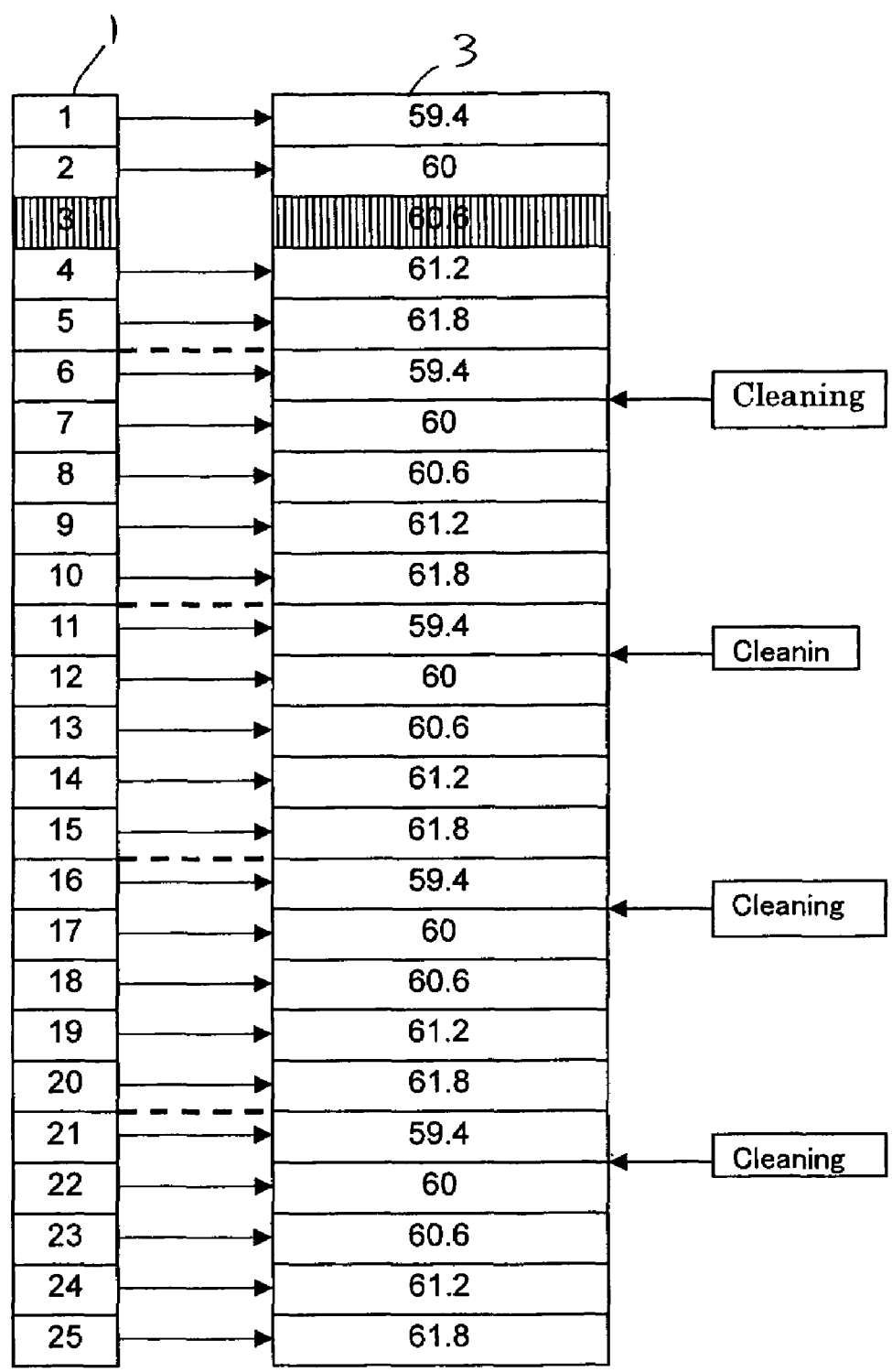
FIG. 13 is a drawing showing another example of control in which the recipe-specific step time for each wafer to be processed is specified directly in a recipe on a conventional semiconductor manufacturing system.

Earlier, it was explained by citing FIG. 13 that a problem will occur if recipe-specific film deposition step times are specified directly as in FIG. 12. In FIG. 7, on the other hand, the correct film deposition times can be always applied to the wafers.

Figure 8:
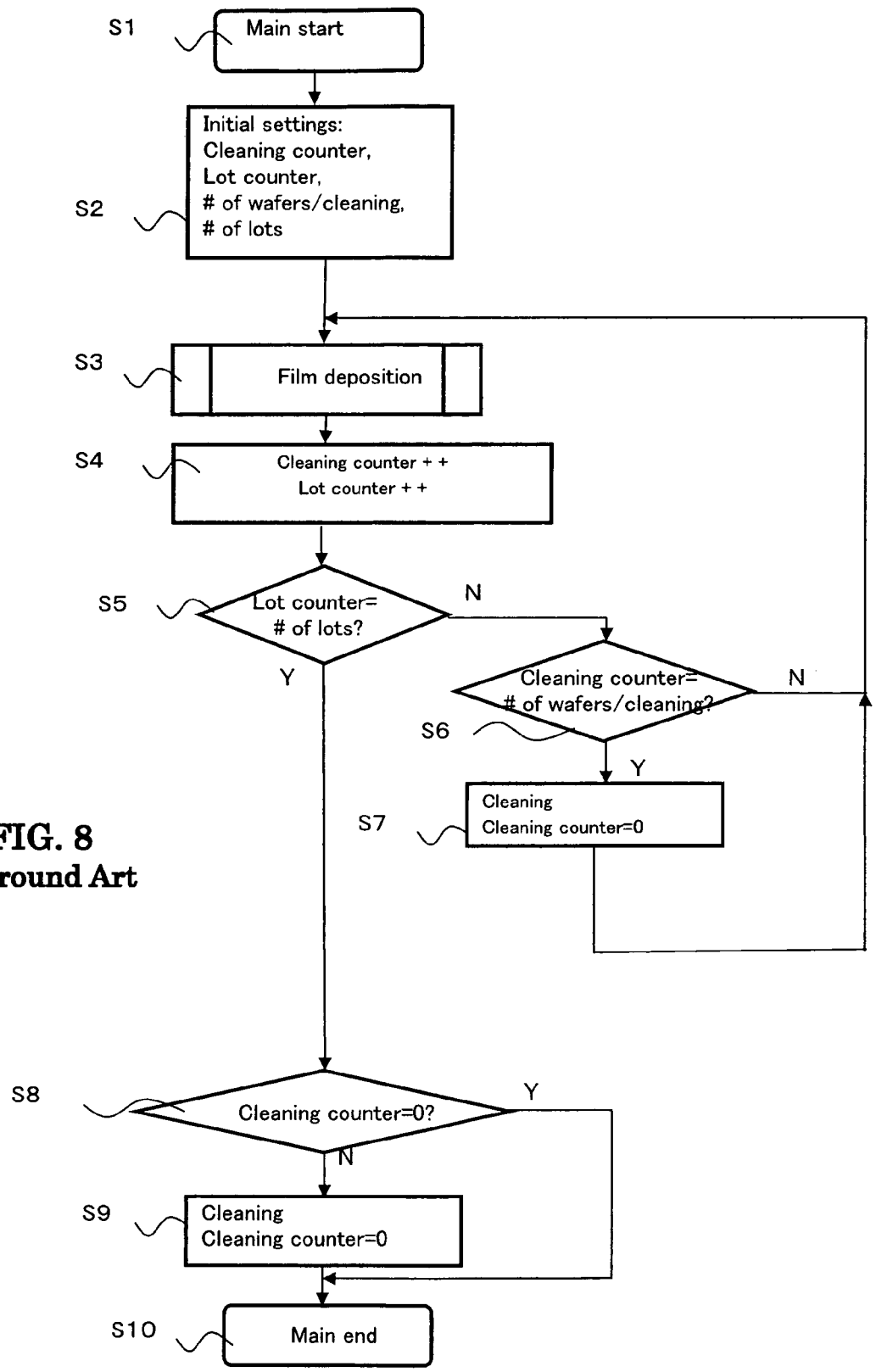
FIG. 8 is a flowchart showing the function of the main control routine of a conventional semiconductor manufacturing system.
Figure 9:
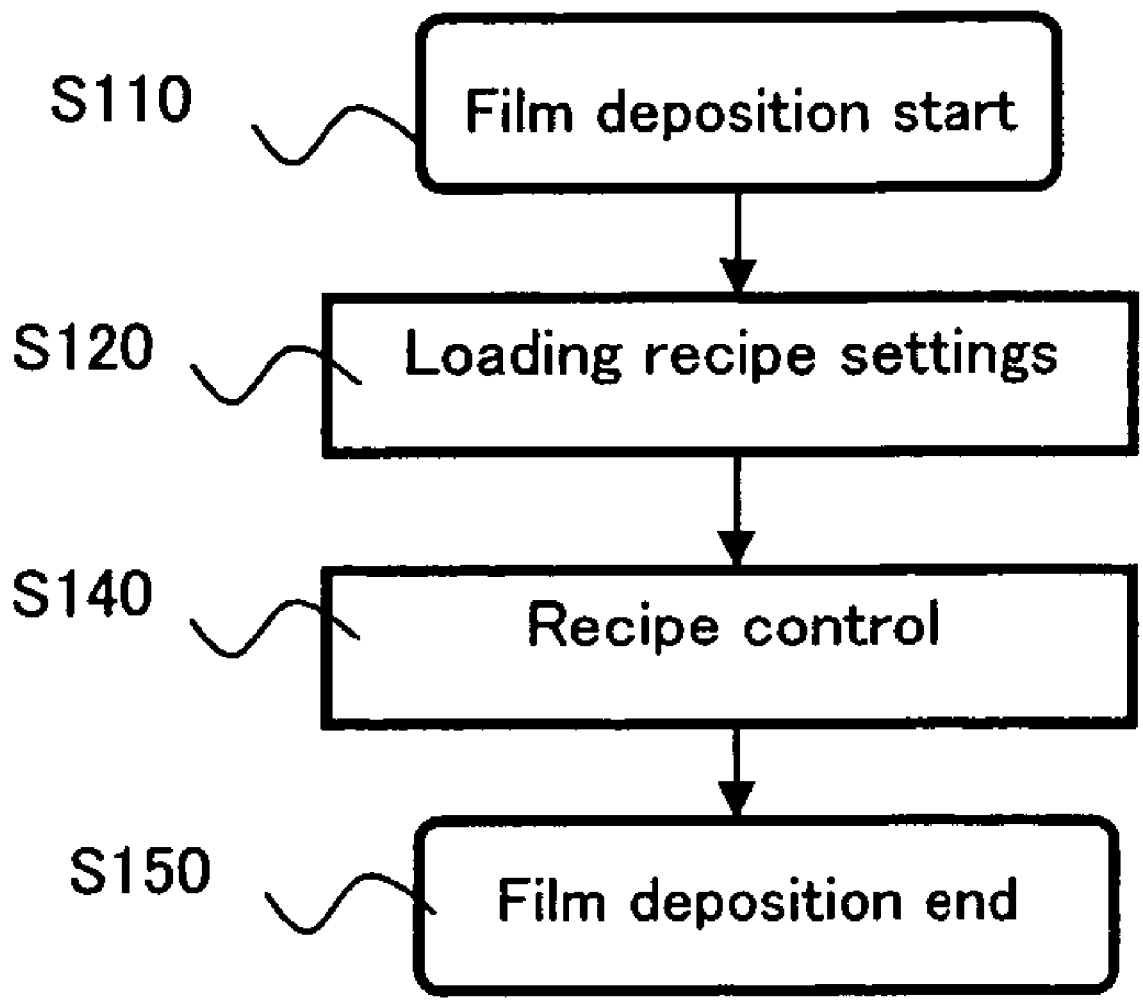
FIG. 9 is a flowchart showing the function of the wafer film deposition subroutine of a conventional semiconductor manufacturing system.

Just like in FIG. 13, slot 3 also contains no wafer in FIG. 7 among the wafers to be processed as specified in the slot column (1). Since correction coefficients are determined by the number of wafers processed after a cleaning process (i.e., the value of the cleaning counter shown in FIG. 3 or 8), the coefficient corresponding to the fifth wafer after a cleaning process, or 0.03, is applied to the wafer in slot 6, thereby adjusting the recipe-specific film deposition step time for this wafer to 61.8 seconds.

As explained above, correcting the step time for each wafer receiving film deposition after a cleaning process, by using a correction coefficient of recipe-specific film deposition step time set for the applicable wafer, will ensure that the correct correction will be applied even when no wafer exists in a given scheduled slot and thus eliminate inconsistency resulting from condition change in the reactor chamber according to the number of wafers processed.

In addition, one embodiment of the present invention specifies correction coefficients as ratios (percentages) of the base step time, which allows for direct application of coefficients to other recipes using different step times. Although the above example explained a case where the base recipe-specific step time was 60 seconds, the step times can be corrected properly, without problems, regardless of the base step time.

The aforementioned embodiments were explained by using recipe-specific film deposition step time as an example. It should be noted, however, that application of the correction coefficients under the present invention is not limited to recipe-specific film deposition step time. It is clear to those skilled in the art that the correction coefficients proposed by the present invention are also applicable to various process conditions such as gas flow rate, pressure and temperature.

Also, the aforementioned embodiments were explained by using, as an example, correction coefficients that are set for the respective wafers to be processed after cleaning of the reactor chamber. However, it is clear to those skilled in the art that the correction coefficients presented in the above examples can also be applied after the condition in the reactor chamber changes due to vacuuming, restoration of atmospheric pressure and various other operations, not just due to cleaning. In addition, the present invention can be effectively applied to cases where the step times are changed in accordance with change in pressure condition—not only in multiple-deposition, single-etching but also in single-deposition, single-etching. For example, the present invention can be applied to change the step times based on pressure condition in a case where a given film deposition speed is used at a pressure of 5 Pa and another film deposition speed is used at a pressure of 100 Pa. These correction coefficients that compensate for pressure change can also be applied in case of unexpected circumstances, such as leaks from the reactor chamber.

To summarize, the present invention can be applied to those systems that change, as the processing targets are processed, the processing times and other parameters in accordance with the number of processing runs performed.

As explained above, a given embodiment of the present invention provides a semiconductor manufacturing system that uses correction coefficients of recipe-specific step time to achieve stable film deposition result free from inconsistency among individual wafers, even when wafers are not present in the scheduled slots or when a recipe using different processing times is applied.

The present invention further includes the following embodiments.

1) A semiconductor manufacturing system with software that controls the wafer film deposition process, wherein the aforementioned software stores correction coefficients of process conditions for each wafer to be processed.

2) A semiconductor manufacturing system as described in 1) above, wherein the aforementioned software stores correction coefficients of process conditions for each wafer to be processed after condition change occurs in the reactor chamber.

3) A semiconductor manufacturing system as described in 2) above, wherein the aforementioned software stores correction coefficients of process conditions for each wafer to be processed after a cleaning process is performed in the reactor chamber.

4) A semiconductor manufacturing system as described in 1) above, wherein the aforementioned software stores a correction coefficient of recipe-specific film deposition step time for each wafer to be processed.

5) A semiconductor manufacturing system as described in 4) above, wherein the aforementioned software stores a correction coefficient of recipe-specific film deposition step time for each wafer to be processed after a cleaning process is performed in the reactor chamber.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. An operation method of a recipe control process in which multiple processing targets are processed in sequence under conditions continuously in a processing apparatus using recipes that specify a set of control parameters specifying the processing conditions of processing targets, wherein the targets are each placed in numbered places prior to the processing, and different values of at least one control parameter are set for different targets processed in sequence, said method comprising:

setting a reference value for the at least one control parameter;

allocating the recipes to the numbered places in sequence, said recipes having the reference value for the at least one control parameter;

specifying correction coefficients which lead to the different values of the at least one control parameter, respectively, by correcting the reference value for the at least one control parameter;

applying the correction coefficients to the targets in sequence which are subjected to the processing; and performing the recipe control process for multiple processing targets by using the correction coefficients applied to the respective processing targets so as to apply in sequence the recipes having the different values of the at least one of the parameters to the respective processing targets.

2. The method according to claim 1, wherein the correction coefficients are functions of count of processed targets.

3. The method according to claim 2, further comprising resetting the count every time a state inside the processing apparatus changes.

4. The method according to claim 1, wherein the processing target is a semiconductor substrate.

5. The method according to claim 4, wherein the process is a film deposition process on semiconductor substrates.

6. The method according to claim 5, wherein the at least one of the parameters is film deposition time.

7. The method according to claim 3, wherein the processing target is a semiconductor substrate, the process is a film deposition process on semiconductor substrates, and the state change inside the processing apparatus is caused by a cleaning process in the processing apparatus.

8. An operation method of a processing system in which one processing that includes multiple processing operations is repeated multiple times and in which conditions of each processing operation are controlled by parameters, said method comprising:

specifying recipes, each assigning values of the parameters to each processing operation in each processing run;

setting a reference value for the at least one control parameter;

allocating the recipes to scheduled runs in sequence, said recipes having the reference value for the at least one control parameter;

specifying correction coefficients which lead to the different values of the at least one control parameter, respectively, by correcting the reference value set for the at least one control parameter; and starting processing according to the recipes by applying the correction coefficients to the processing runs in sequence where the recipes are actually performed so as to apply in sequence the recipes having the different values of the at least one of the parameters to the actually performed processing runs.

9. The method according to claim 8, wherein the processing is a processing of semiconductor substrates.

10. The method according to claim 9, wherein the number of runs of the processing corresponds to the number of semiconductor substrates.

11. The method according to claim 10, wherein the at least one process is a film deposition process on semiconductor substrates.

12. The method according to claim 11, wherein the at least one parameter is film deposition time.

13. The method according to claim 10, wherein the correction coefficients return to their initial values every time the state inside the reactor chamber changes.

14. The method according to claim 13, wherein the state change inside the reactor chamber is caused by a cleaning process in the reactor chamber.

15. A method of depositing films on semiconductor substrates which are transferred from numbered slots, comprising:

providing recipes that specify a set of control parameters specifying the processing conditions of processing targets, wherein different values of at least one control parameter are set for different substrates processed in sequence;

setting a reference value for the at least one control parameter;

allocating the recipes to the numbered slots in sequence, said recipes having the reference value for the at least one control parameter;

specifying correction coefficients which lead to the different values of the at least one control parameter, respectively, by correcting the reference value set for the at least one control parameter;

applying the correction coefficients to the substrates in sequence which are subjected to the processing; and depositing films on the substrates from the numbered slots in sequence by using the correction coefficients applied to the respective semiconductor substrates so as to apply in sequence the recipes having the different values of the at least one of the parameters' values to the respective substrates.

16. The method according to claim 15, wherein the correction coefficients are a set of coefficients applied when the state inside the reactor chamber changes, and these coefficients return to their initial values every time the state changes.

17. The method according to claim 16, wherein the state change inside the reactor chamber is caused by a cleaning process in the reactor chamber.

18. The method according to claim 16, wherein the cleaning process is performed after films have been deposited on multiple semiconductor substrates.

19. The method according to claim 18, wherein the correction coefficients are coefficients for film deposition time on semiconductor substrates.

20. A processing system in which one processing that includes multiple processes is repeated multiple times and in which the conditions of each process are controlled by parameters, said processing system comprising:

a unit that specifies recipes for assigning the parameters' values to each process in each processing run, wherein a reference value for the at least one control parameter is set, and the recipes are allocated to scheduled runs in sequence, said recipes having the reference value for the at least one control parameter;

a unit that specifies correction coefficients which lead to the different values of the at least one control parameter, respectively, by correcting the reference value set for the at least one control parameter; and a unit that starts the processing according to the recipes by applying the correction coefficients to the processing runs in sequence in which the recipes are actually performed so as to apply in sequence the recipes having the different values of the at least one of the parameters to the actually performed processing runs.

* * * * *